United States Patent
Ryu et al.

(10) Patent No.: US 10,297,980 B2
(45) Date of Patent: May 21, 2019

(54) STACKABLE ELECTRICALLY-ISOLATED DIODE-LASER BAR ASSEMBLY

(71) Applicant: Coherent, Inc., Santa Clara, CA (US)

(72) Inventors: Geunmin Ryu, San Jose, CA (US); Athanasios Chryssis, Santa Clara, CA (US); David Schleuning, Oakland, CA (US)

(73) Assignee: Coherent, Inc., Santa Clara, CA (US)

(*) Notice: Subject to any disclaimer, the term of this patent is extended or adjusted under 35 U.S.C. 154(b) by 0 days.

(21) Appl. No.: 15/377,222

(22) Filed: Dec. 13, 2016

(65) Prior Publication Data

US 2017/0179686 A1    Jun. 22, 2017

Related U.S. Application Data

(60) Provisional application No. 62/268,327, filed on Dec. 16, 2015.

(51) Int. Cl.
| | |
|---|---|
| *H01S 5/40* | (2006.01) |
| *H01S 5/022* | (2006.01) |
| *H01S 5/30* | (2006.01) |
| *H01S 5/024* | (2006.01) |

(52) U.S. Cl.
CPC ........ *H01S 5/4025* (2013.01); *H01S 5/02272* (2013.01); *H01S 5/02276* (2013.01); *H01S 5/02423* (2013.01); *H01S 5/3013* (2013.01); *H01S 5/4018* (2013.01); *H01S 5/02469* (2013.01); *H01S 5/02476* (2013.01); *H01S 5/405* (2013.01); *H01S 5/4031* (2013.01)

(58) Field of Classification Search
CPC .... H01S 5/4025; H01S 5/4018; H01S 5/3013; H01S 5/02276; H01S 5/02423; H01S 5/02272; H01S 5/405; H01S 5/4031; H01S 5/02476; H01S 5/02469
See application file for complete search history.

(56) References Cited

U.S. PATENT DOCUMENTS

| | | | |
|---|---|---|---|
| 6,240,116 B1 * | 5/2001 | Lang | ................... G02B 27/0905 372/108 |
| 8,483,249 B1 | 7/2013 | Govorkov et al. | |
| 8,804,781 B2 | 8/2014 | Schleuning et al. | |
| 8,804,782 B2 | 8/2014 | Schleuning et al. | |
| 9,001,856 B1 | 4/2015 | Govorkov et al. | |
| 9,065,238 B2 | 6/2015 | Schleuning et al. | |
| 2002/0089913 A1 * | 7/2002 | Moriyama | ............. G11B 7/127 369/53.26 |
| 2012/0045161 A1 | 2/2012 | Okada | |
| 2015/0055667 A1 * | 2/2015 | Horn | ................... H01S 5/02208 372/36 |

OTHER PUBLICATIONS

International Search Report and Written Opinion received for PCT Patent Application No. PCT/US2016/066381, dated Mar. 16, 2017, 16 pages.

* cited by examiner

*Primary Examiner* — Xinning (Tom) Niu
(74) *Attorney, Agent, or Firm* — Morrison & Foerster LLP

(57) ABSTRACT

A diode-laser assembly having an electrically isolated diode-laser bar on a cooled base-element is disclosed. The diode-laser bar is electrically isolated from the base-element and electrically isolated from any coolant water, thereby eliminating the need for de-ionized water and mitigating corrosion due to galvanic action. Multiple such diode-laser assemblies are stackable, with small bar-to-bar pitch, enabling a high-current and high-brightness diode-laser stack.

20 Claims, 7 Drawing Sheets

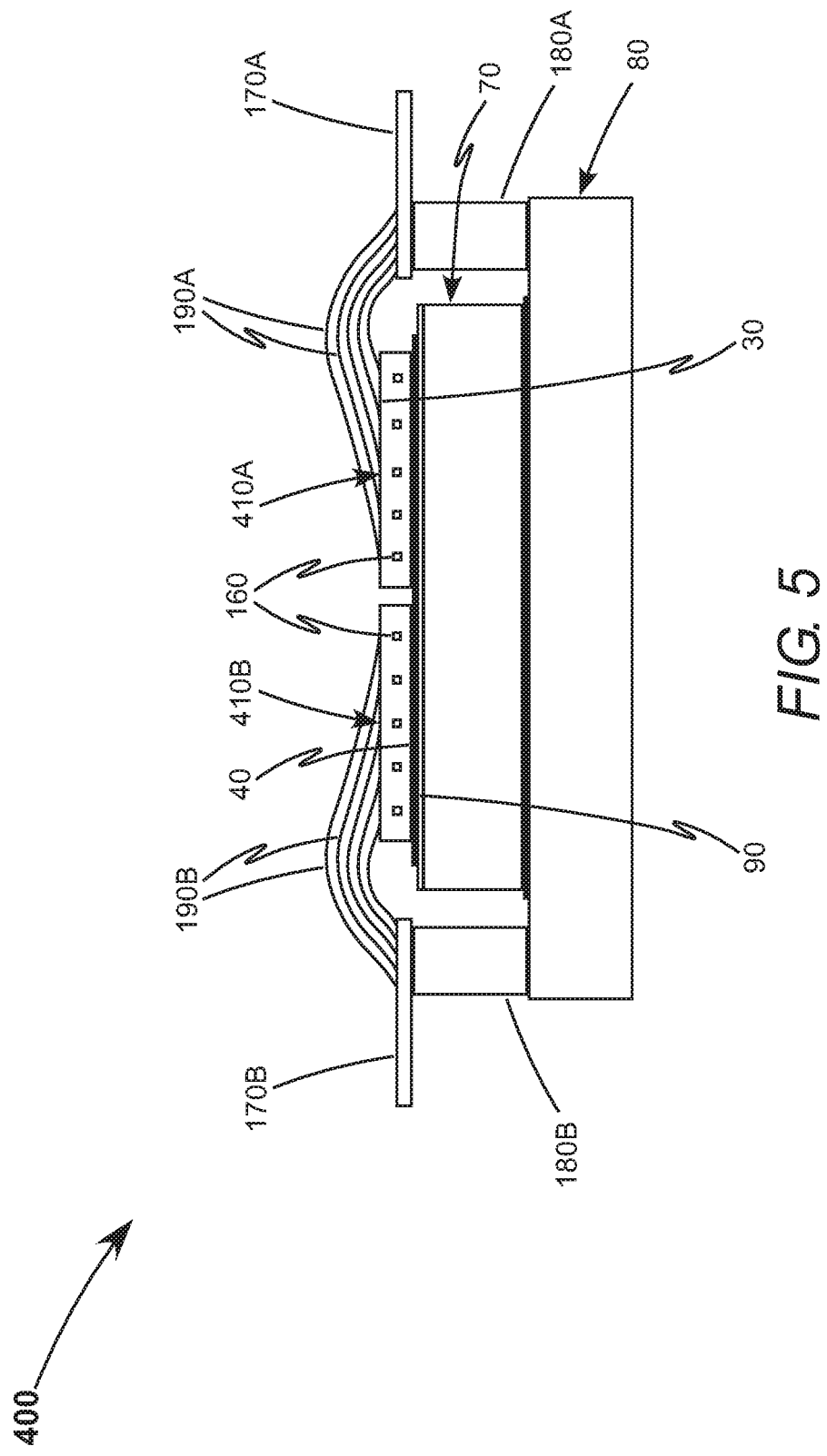

STACKABLE ELECTRICALLY-ISOLATED DIODE-LASER BAR ASSEMBLY

PRIORITY

This application claims priority to U.S. Provisional Patent Application No. 62/268,327, filed Dec. 16, 2015, the entire disclosure of which is incorporated herein by reference.

TECHNICAL FIELD OF THE INVENTION

The present invention relates in general to diode-laser bar packaging. The invention relates in particular to packaging diode-laser bars on water-cooled heat-sinks.

DISCUSSION OF BACKGROUND ART

Diode-lasers are efficient devices for converting electrical power into coherent optical power. An edge-emitting diode-laser has a diode-laser emitter, which is a type of waveguide laser-resonator, grown on a single-crystal substrate. The diode-laser emitter emits laser-radiation through an end facet in an emission direction. For high-power applications, a diode-laser bar having a plurality of diode-laser emitters provides a convenient way to scale the optical power available from a single diode-laser emitter. A diode-laser bar has typically between 10 and 60 such diode-laser emitters spaced apart and arranged in a "horizontal" linear array thereof. For further power scaling, a plurality of diode-laser bars can be stacked "vertically" to make a two-dimensional array of diode-laser emitters. Diode-laser bars arranged in this manner are typically referred to as a "vertical stack".

A diode-laser bar includes a plurality of semiconductor layers epitaxially grown on the substrate, with the diode-laser emitters defined in the epitaxial layers. Typically, the substrate is an n-type substrate, and layers are grown such that layers forming the "p-side" (anode-side) of the diodes are uppermost.

The term "packaging" applied to diode-laser bars refers to mounting a diode-laser bar, or an array of diode-laser bars, on some sort of cooling-base or heat-sink. The base is usually made of copper. In a "conductively cooled package" (CCP) the base has sufficient mass to remove waste heat from the diode-laser bar. For higher power operation, the base is typically water-cooled, for example through a micro-channel arrangement. The diode-laser bar is soldered "p-side down" either directly onto the base or via a submount. The submount is made of a material having a coefficient of thermal expansion (CTE) between that of the substrate material and the base material, generally a material having a CTE close to that of the substrate material.

Electrical connection to the diode-laser bars places the base, and cooling-water therein, in electrical contract with the diode-laser bar energizing circuit. In an array of diode-laser bars, the water can short-circuit electric connection to the bars, unless the electrical conductivity of the water is low. A common solution to this is to use de-ionized (DI) or high-resistance water. However, DI water is more corrosive on metals than water from conventional building supplies. The use of DI water is also expensive and inconvenient.

Even small "stray" currents through the cooling water, between metal elements at different electric potentials, can cause metal corrosion through galvanic action. In addition to erosion of metal elements, particles produced by galvanic action can block cooling-channels in micro-channel cooled arrangements, which have typical internal dimensions of about 0.5 millimeters (mm) or less. Plating the cooling-water channels with a metal such as gold can mitigate such corrosion. However, plating internal channels by immersion-plating (usually using forced-flow plating solutions) results in uneven plating that is difficult to inspect for quality assurance.

There is a need for an improved diode-laser bar assembly, having the cooling-water electrically isolated from both the n-side and p-side electrical potentials. Such an assembly should preferably not require the use of de-ionized water.

SUMMARY OF THE INVENTION

In one aspect, electro-optical apparatus in accordance with the present invention comprises a base-element and an electrically-insulating submount. The submount has first and second opposite surfaces. The first surface is metallized. The second surface is bonded to the base-element. A diode-laser bar is provided having a p-side and an n-side. The p-side is bonded to the metallized first surface of the submount, leaving a portion of the metalized first surface exposed. First and second electrical contacts are provided. Each electrical contact is on an electrical insulator attached to the base-element and spaced apart from the submount. A first flexible electrical connector is provided, extending between the first electrical contact and the exposed metalized layer on the submount. A second flexible electrical connector is provided, extending between the second electrical contact and the n-side of the diode-laser bar.

In another aspect, electro-optical apparatus in accordance with the present invention comprises a base-element and an electrically-insulating submount. The submount has first and second opposite surfaces. The first surface is metallized. The second surface is bonded to the base-element. First and second diode-laser bars are provided. Each diode-laser bar has a p-side and an n-side. The p-sides are bonded to the metallized first surface of the submount, leaving a portion of the metalized first surface exposed. First, second, and third electrical contacts are provided. Each electrical contact is on an electrical insulator attached to the base-element and spaced apart from the submount. A first flexible electrical connector is provided, extending between the first electrical contact and the exposed metalized layer on the submount. A second flexible electrical connector is provided, extending between the second electrical contact and the n-side of the first diode-laser bar. A third flexible electrical connector is provided, extending between the third electrical contact and the n-side of the second diode-laser bar.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 5 is an end-elevation view schematically illustrating another preferred embodiment of diode-laser assembly in accordance with the present invention.

DETAILED DESCRIPTION OF THE INVENTION

Figure 1A:
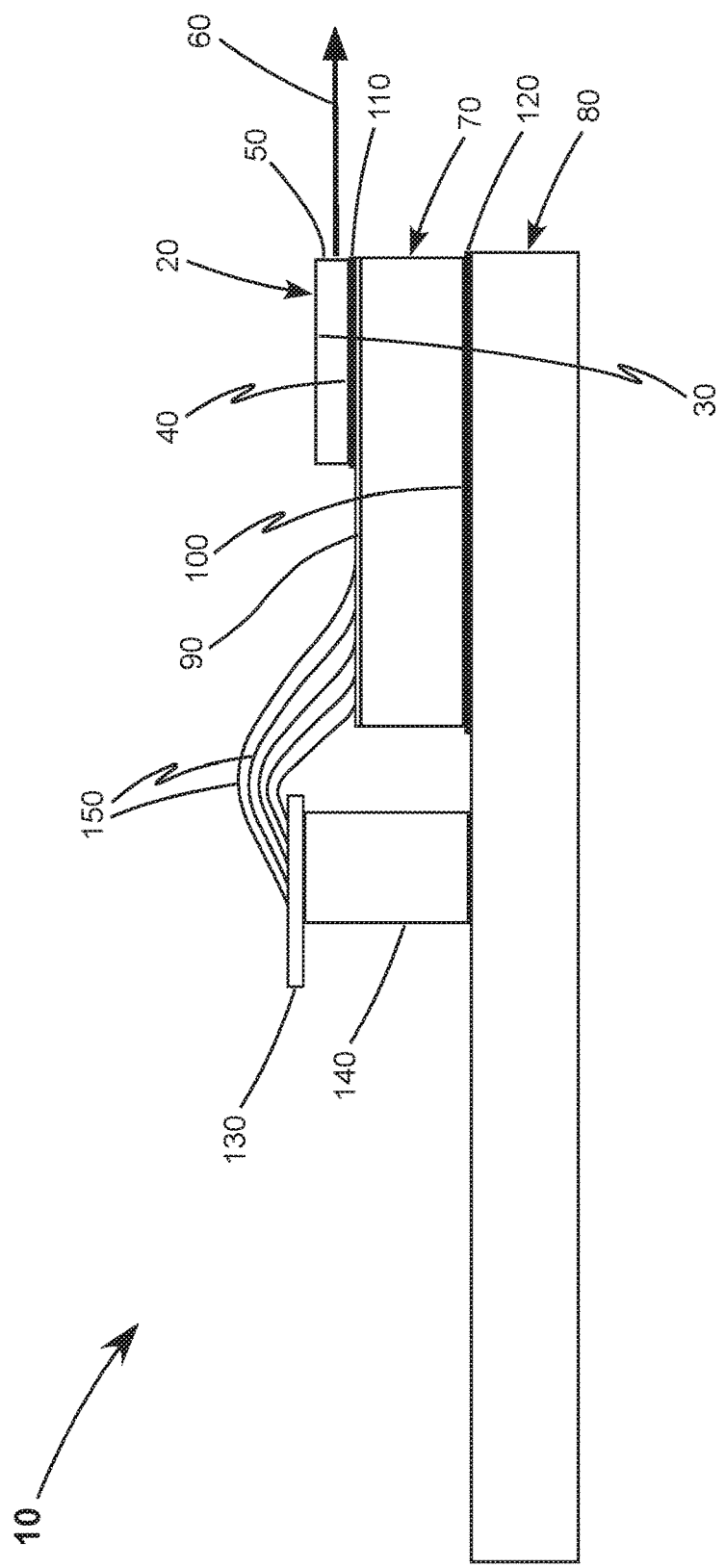
FIG. 1A is a side-elevation view schematically illustrating one preferred embodiment of diode-laser assembly in accordance with the present invention.

Referring now to the drawings, wherein like components are designated by like numerals, FIG. 1A is a side-elevation view schematically illustrating one preferred embodiment of a diode-laser assembly 10 in accordance with the present invention. Diode-laser assembly 10 comprises a rectangular diode-laser bar 20 having an n-side 30, an opposite p-side 40, and a perpendicular emitting face 50. Diode-laser bar 20 generates laser-radiation that propagates in an emission direction 60 when energized by driving an electrical current between n-side 30 and p-side 40. Diode-laser bar 20 is bonded onto a larger rectangular electrically-insulating submount 70, at one end thereof. Diode-laser bar 20 and submount 70 together are bonded onto an even larger rectangular base-element 80, at one end thereof. Emitting face 50 is thereby located at one end of diode-laser assembly 10, as depicted.

Submount 70 has a metalized surface 90 that is electrically conducting and an opposite surface 100. Metalized surface 90 is preferably made by plating the whole surface with a layer of copper metal. Thick-film metalization technology may be necessary to fabricate a metal layer having sufficient thickness to withstand the electrical current required to energize diode-laser bar 20. Thick-film metallization service is commercially available, for example from Remtec Inc. of Norward Mass. Alternatively, metalized surface 90 may be fabricated using direct-bonded-copper (DBC) technology. DBC bonding service is also commercially available, for example from Rogers Corporation of Rogers Connecticut. Metalized surface 90 has a preferred thickness of between about 25 micrometers (μm) and 125 μm. Surface 100 is also metalized to enable soldering, as described below.

P-side 40 of diode-laser bar 20 is hard soldered onto metalized surface 90 of submount 70, thereby forming a thin hard-solder layer 110. Diode-laser bar 20 only covers a portion of metalized surface 90, exposing the remaining portion of metalized surface 90 to facilitate electrical connection to p-side 40. Surface 100 of submount 70 is soft soldered onto base-element 80, thereby forming a thin soft-solder layer 120.

Submount 70 is made of an electrically-insulating material having a coefficient of thermal expansion (CTE) that matches diode-laser bar 20. By way of example, if diode-laser bar 20 is made of gallium arsenide (GaAs), submount 70 is preferably made of beryllium oxide (BeO). By way of another example, if diode-laser bar 20 is made of indium phosphide (InP), submount 70 is preferably made of aluminum nitride (AlN). Beryllium oxide and aluminum nitride are both ceramic materials that have relatively-high thermal conductivity for electrical insulators.

Base-element 80 is usually made of copper and has plated surfaces to facilitate soldering and for corrosion protection. Gold over nickel is a preferred plating for copper. Hard-solder layer 110 is preferably made of a gold-tin (AuSn) alloy. Soft-solder layer 120 is preferably made of an indium-silver (InAg) alloy, but other soft-solder alloys may be used, such as a tin-silver-copper (SnAgCu) alloy. The preferred materials above protect diode-laser bar 20 from mechanical stress and conduct waste heat from diode-laser bar 20 to base-element 80, while also electrically isolating n-side 30 from base-element 80.

Diode-laser assembly 10 further includes an electrical contact 130 that is attached to a rectangular electrical insulator 140. Insulator 140 is attached to base-element 80 and spaced apart from submount 70. Electrical contact 130 is electrically isolated from base-element 80. A flexible electrical connector 150 extends between electrical contact 130 and metalized surface 90.

Figure 1B:
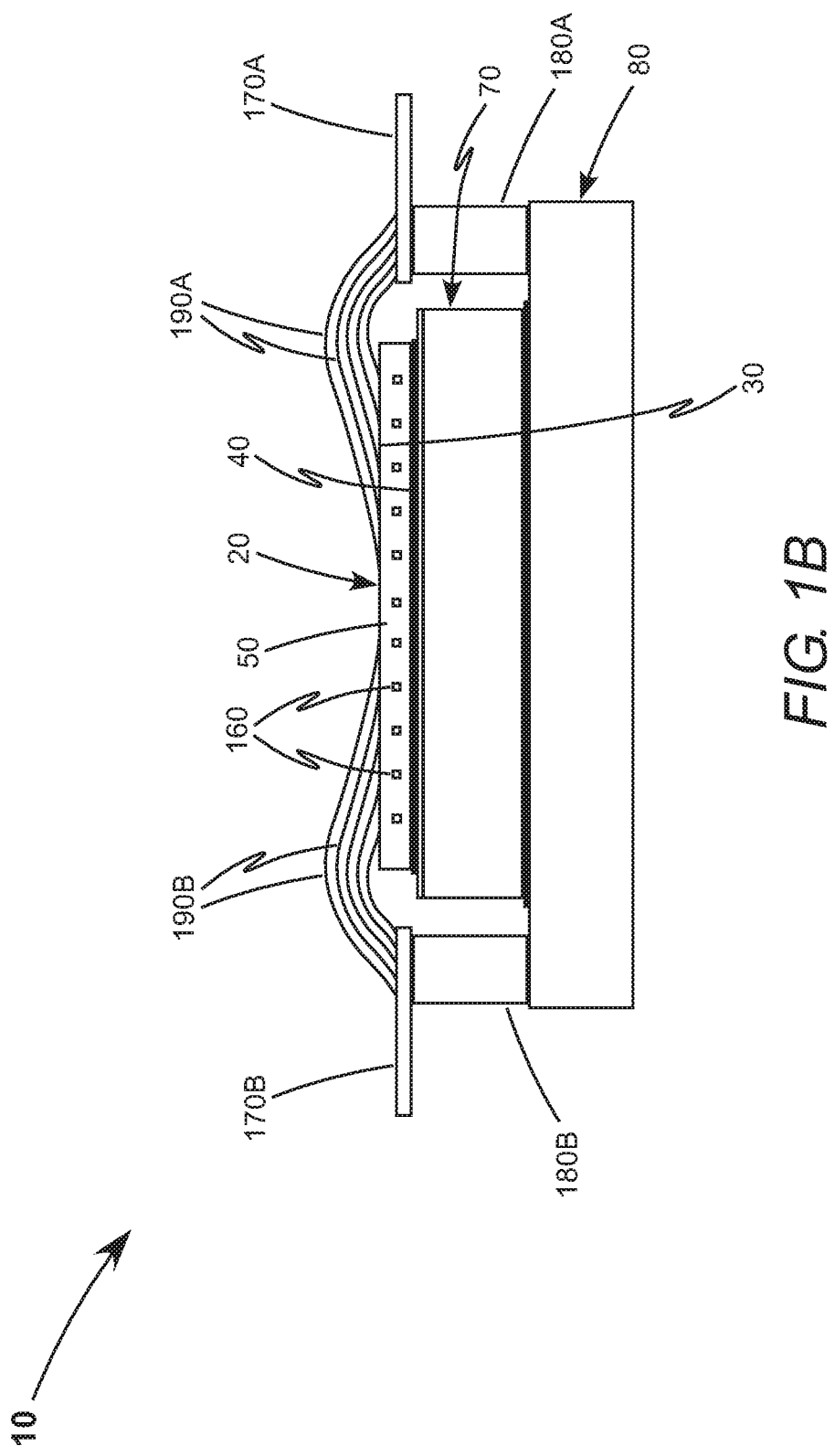
FIG. 1B is an end-elevation view schematically illustrating the diode-laser assembly of FIG. 1A.

FIG. 1B is an end-elevation view schematically illustrating further details of diode-laser assembly 10. Emitting face 50 includes a plurality of diode-laser emitters 160 that are electrically connected internally to n-side 30 and p-side 40 of diode-laser bar 20. Although eleven diode-laser emitters 160 are depicted, the actual number of diode-laser emitters 160 would be specific to the diode-laser bar selected for a particular application.

Diode-laser assembly 10 further includes an electrical contact 170A affixed to a rectangular electrical insulator 180A. Insulator 180A is attached to base-element 80 on one side of submount 70 and separated apart therefrom. Electrical contact 170A is electrically isolated from base-element 80. A flexible electrical connector 190A extends between electrical contact 170A and n-side 30. Similarly, an electrical contact 170B affixed to an electrical insulator 180B is attached to base-element 80 on the opposite side of submount 70. A flexible electrical connector 190B extends between electrical contact 170B and n-side 30. This arrangement having two flexible electrical connectors 190A and 190B provides redundant electrical connection to n-side 30 and enables higher currents to be supplied to diode-laser bar 20.

Insulators 140, 180A, and 180B may be combined into a single unitary insulator element, without departing from the spirit and scope of the present invention. It should be noted that elements 170A, 170B, 180A, 180B, 190A, and 190B are omitted from FIG. 1A for simplicity of illustration. Similarly, elements 130, 140, and 150 are omitted from FIG. 1B for simplicity of illustration.

Figure 1C:
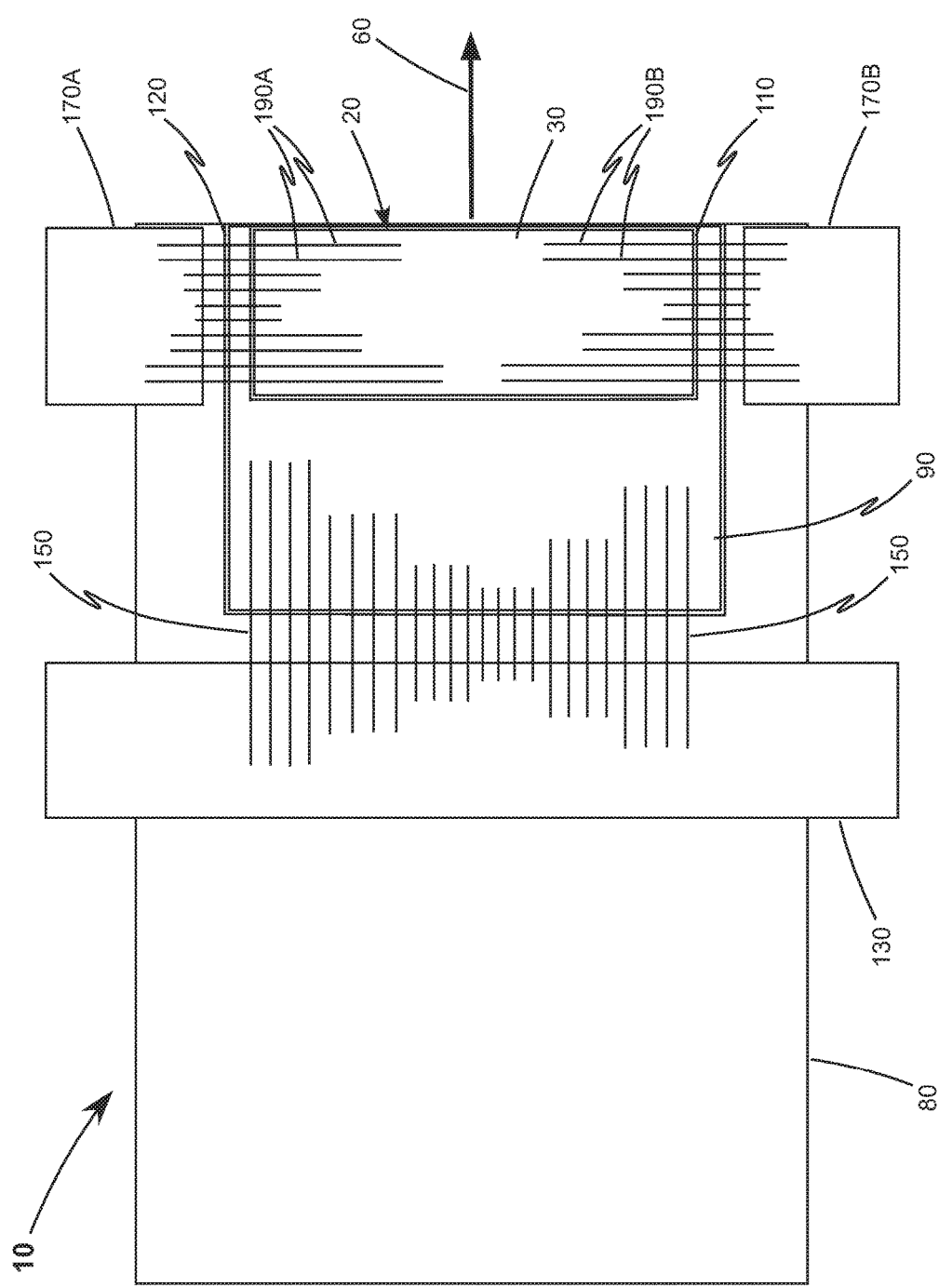
FIG. 1C is a plan-view schematically illustrating the diode-laser assembly of FIG. 1A.

FIG. 1C is a plan-view schematically illustrating further details of diode-laser assembly 10. Electrical contacts 130, 170A, and 170B each extend laterally beyond the other elements of assembly 10, to facilitate external electrical connection to laser-diode bar 20. Electrical connection to p-side 40 (not visible) is made through electrical contact 130, flexible electrical connector 150, and metalized surface 90. Electrical connection to n-side 30 is made through electrical contacts 170A and 170B and through flexible electrical connectors 190A and 190B. Flexible electrical connectors 150, 190A, and 190B are preferably made using wire-bond or ribbon-bond technologies, whereby each connector includes a plurality of high-gauge "wires". These flexible connector technologies are preferred because they do not induce mechanical stress on diode-laser bar 20 and they have low electrical inductance for high-speed applications.

Regarding exemplary dimensions for diode-laser assembly 10, base-element 80 has preferred dimensions of about 33 mm (length)×about 14 mm (width)×about 1.4 mm (height). Submount 70 has a preferred width of about 11.5 mm and a preferred height of about 0.77 mm. Diode-laser bar 20 has a preferred height of about 0.14 mm.

Figure 2:
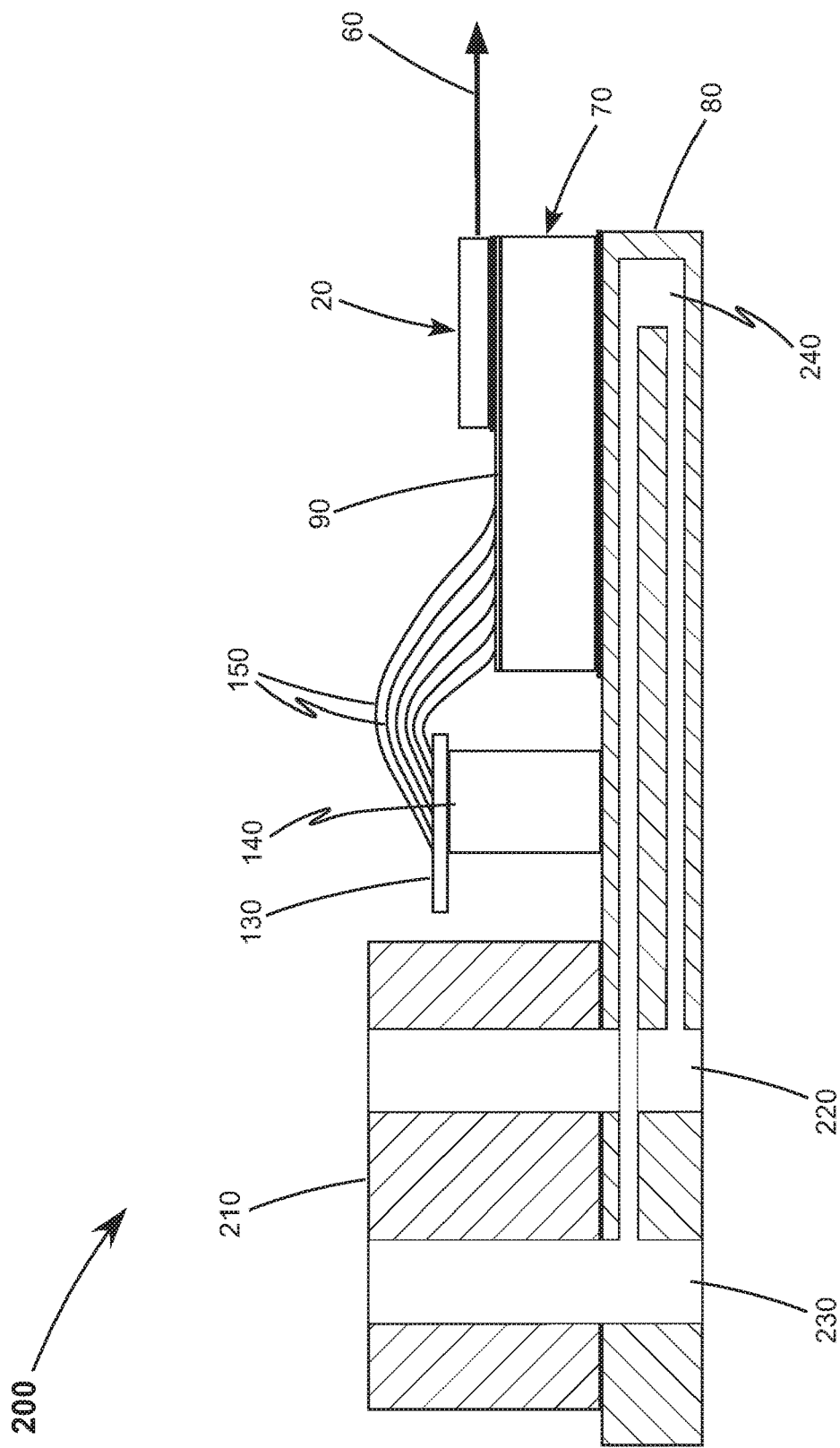
FIG. 2 is a side-elevation view, partially in cross-section, schematically illustrating another preferred embodiment of diode-laser assembly in accordance with the present invention, similar to the embodiment of FIG. 1A, but further including a spacer for vertical stacking.

FIG. 2 is a side-elevation view, partially in cross-section, schematically illustrating another preferred embodiment of diode-laser assembly 200 in accordance with the present invention. Diode-laser assembly 200 is similar to diode-laser assembly 10, but further includes a spacer 210, an inlet port 220, an outlet port 230, and a coolant channel 240. Spacer 210 enables vertical stacking of a plurality of such diode-laser assemblies. Spacer 210 has a preferred height of between about 1.3 mm and 1.6 mm for compatibility with the exemplary dimensions above, most preferably about 1.6 mm. Inlet port 220 and outlet port 230 extend through the full thickness of base-element 80 and spacer 210. Inlet port 220 and outlet port 230 are fluidly connected inside base-element 80 by coolant channel 240.

Figure 3:
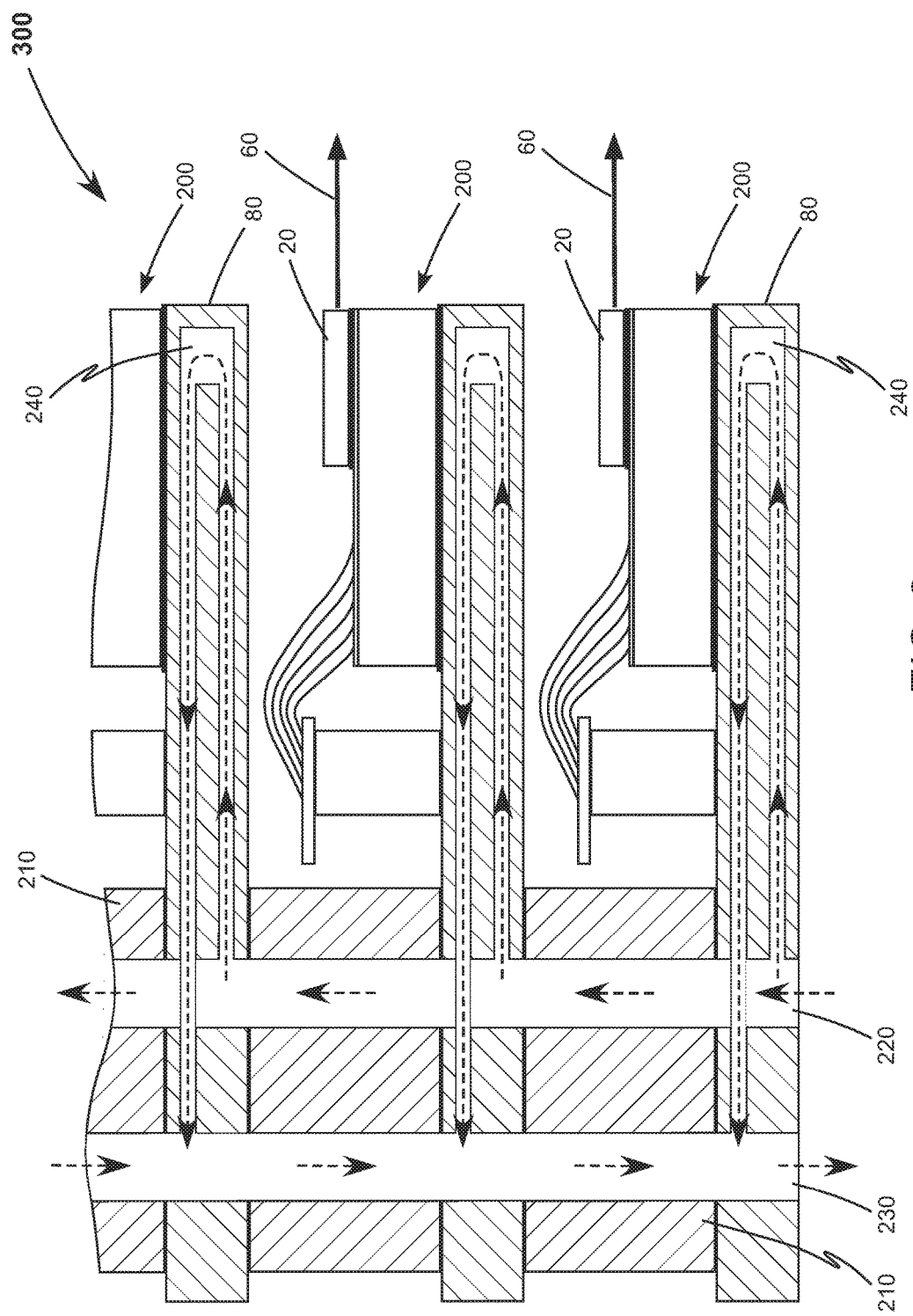
FIG. 3 is a side-elevation view, partially in cross-section, schematically illustrating a preferred embodiment of diode-laser stack in accordance with the present invention having coolant water flowing therein.

FIG. 3 is a side-elevation view, partially in cross-section, schematically illustrating one preferred embodiment 300 of diode-laser stack in accordance with the present invention. At least three diode-laser assemblies 200 are depicted stacked together vertically for power scaling. More or less assemblies can be stacked together as required by a particular application, without departing from the spirit and scope of the present invention. Diode-laser assemblies 200 are stacked together using spacers 210. This arrangement minimizes mechanical stress transferred to diode-laser bars 20.

The drawing illustrates coolant water flow (dashed arrowed line) through stack 300. Diode-laser assemblies 200 are in parallel fluid connection between inlet port 220 and outlet port 230. Coolant water flows under pressure from an external supply (not shown) through inlet port 220, through coolant channel 240 within each one of the diode-laser assemblies 200, and returns through outlet port 230. Waste heat conducted away from each one of the diode-laser bars 20 is removed by the flowing coolant water. Each one of the coolant channels 240 may incorporate a micro-channel arrangement (not depicted) to maximize contact between the coolant water and base-element 80 at the end thereof proximate to diode-laser bar 20.

Figure 4:
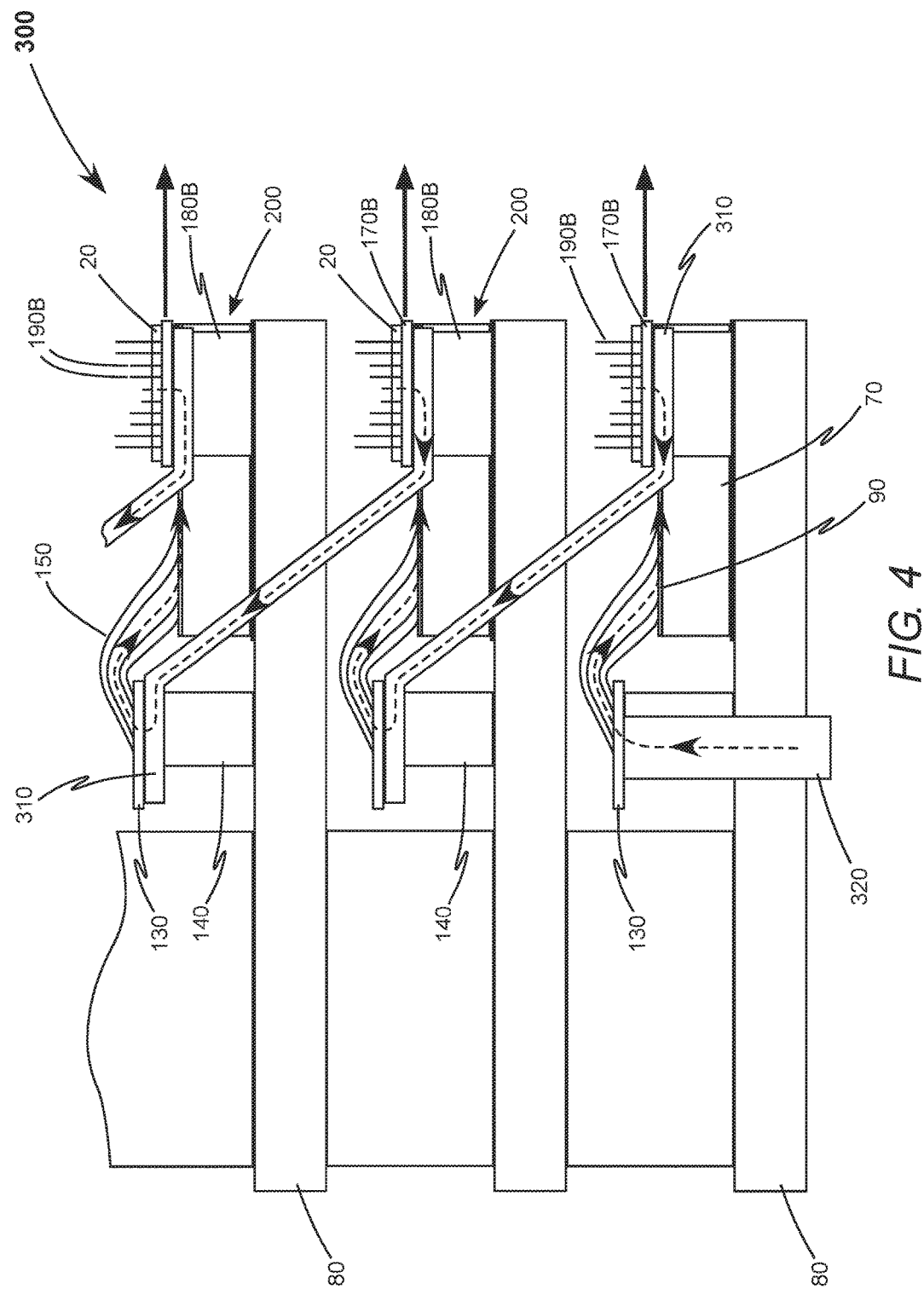
FIG. 4 is a side-elevation view schematically illustrating electrical current flow through the diode-laser stack of FIG. 3.

FIG. 4 is a side-elevation view schematically illustrating conventional current flow (dashed arrowed line) through diode-laser stack 300. Stack 300 further includes a plurality of interconnectors 310 that electrically connect electrical contact 170B of each one of the diode-laser assemblies 200 to electrical contact 130 of the diode-laser assembly immediately above. Although not visible in the drawing, interconnectors 310 may also connect electrical contact 170A of each diode-laser assembly 200 to electrical contact 130 of the diode-laser assembly immediately above. Interconnectors 310 thereby electrically connect the n-side of each one of the diode-laser bars 20 to the p-side of the diode-laser bar immediately above. Terms "above" and "below" are used here for convenience of description, and are not meant to imply specific spatial orientations of the stack in use.

Interconnectors 310 may be soldered to the electrical contacts (as depicted) or attached to the electrical contacts using mechanical fasteners, as appropriate for a particular application. Soldering provides robust mechanical attachment, although there may be electrical resistance across each solder interface, which would cause an unwanted cumulative power loss. Fasteners provide direct contact and enable quick assembly and disassembly of the stack. For example, interconnector 310 may be threaded to accept a standard screw as a fastener.

An optional anode connector 320 is depicted that enables convenient electrical connection to electrical contact 130 of the diode-laser assembly at the bottom of stack 300. Current originates from an external current source (not shown), flows through anode connector 320, and then flows alternately through each diode-laser assembly 200 and each interconnector 310. Current returning to the external current source from the top of stack 300 is not depicted for simplicity of illustration.

Alternatively, the stacked diode-laser assemblies may be supplied with current individually, by omitting interconnectors 310 and connecting one or more external current sources directly to electrical contacts 130, 170A, and 170B. This alternative arrangement has an advantage that individual diode-laser assemblies may be energized to control the vertical distribution of laser-radiation emitted by diode-laser stack 300. Yet another advantage is that a fraction of the diode-laser bars may be operated at higher currents in an application that is sensitive to the wavelength of the laser-radiation, especially when ramping from low to high powers. In general, serially connecting the stacked diode-laser assemblies to a common current source is more convenient and more cost effective than energizing the diode-laser assemblies individually.

Within each diode-laser assembly 200, conventional current flows in turn through electrical contact 130, flexible electrical connector 150, metalized surface 90, diode-laser bar 20, flexible electrical connectors 190A and 190B, and electrical contacts 170A and 170B. Each base-element 80 is electrically isolated from the externally supplied current by submount 70, insulator 140, and insulators 180A (not visible) and 180B. The coolant water depicted in FIG. 3 is thereby electrically isolated from the externally supplied current.

Whether diode-laser assemblies 200 are supplied with current individually or in series, it is preferable to connect all base-elements 80 to a common ground that is electrically isolated from externally supplied current. It is also preferable to electrically connect all metal elements in contact with the coolant water to a common ground, thereby mitigating any stray currents that could cause corrosion.

FIG. 5 is an end-elevation view schematically illustrating yet another preferred embodiment of diode-laser assembly 400 in accordance with the present invention. Diode-laser assembly 400 is similar to diode-laser assembly 10, but has two diode-laser bars 410A and 410B instead of one diode-laser bar 20. P-sides 40 of diode-laser bars 410A and 410B are hard soldered onto metalized surface 90. N-side 30 of diode-laser bar 410A is connected to electrical contact 170A through flexible electrical connector 190A. N-side 30 of diode-laser bar 410B is connected to electrical contact 170B through flexible electrical connector 190B.

Each diode-laser bar in diode-laser assembly 400 may be supplied with current individually by connecting independent external current sources to electrical contacts 170A and 170B. This arrangement enables diode-laser bars 410A and 410B to be energized separately to control the horizontal distribution of laser-radiation emitted by diode-laser assembly 400. This arrangement also reduces the current required by each one of the diode-laser bars in diode-laser assembly 400 compared to the one diode-laser bar in diode-laser assembly 10.

Returning to FIGS. 3 and 4, diode-laser assemblies 200 in diode-laser stack 300 are preferably stacked with minimum bar-to-bar pitch, to maximize the brightness of the laser-radiation emitted from the stack. For the exemplary dimensions above and the most-preferable 1.6 mm height of spacer 210, the bar-to-bar pitch is 3.0 mm. Although the present invention solves problems of electrical isolation and corrosion when using coolants containing water, the invention could be used with anhydrous coolants without departing from the spirit and scope of the present invention.

The present invention is described above in terms of a preferred embodiment and other embodiments. The invention is not limited, however, to the embodiments described and depicted herein. Rather, the invention is limited only by the claims appended hereto.

What is claimed is:

1. Electro-optical apparatus comprising:
   first and second diode laser assemblies, each diode laser assembly comprising;
   a base-element;
   an electrically-insulating submount having first and second opposite surfaces, the first surface being metallized, and the second surface being bonded to the base-element;
   a diode-laser bar having a p-side and an n-side, the p-side being bonded to the metallized first surface of the submount, leaving a portion thereof exposed, wherein the bar includes an array of emitters emitting light in a forward direction;
   first and second electrical contacts each thereof on an electrical insulator attached to the base-element and spaced apart from the submount, and wherein the first electrical contact is located behind the submount and the second electrical contact is located on one side of the submount;
   a first flexible electrical connector extending between the first electrical contact and the exposed metalized layer on the submount;
   a second flexible electrical connector extending between the second electrical contact and the n-side of the diode-laser bar, and wherein the first diode laser assembly is mounted vertically with respect to the second diode laser assembly, with the emitter arrays of both assemblies being substantially coplanar; and
   an electrical interconnect between the first electrical contact of the first diode laser assembly and the second electrical contact of the second diode laser assembly.

2. The apparatus of claim 1, wherein the metalized first surface of the submount is made of copper.

3. The apparatus of claim 1, wherein the diode-laser bar is made of gallium arsenide and the submount is made of beryllium oxide.

4. The apparatus of claim 1, wherein the diode-laser bar is made of indium phosphide and the submount is made of aluminum nitride.

5. The apparatus of claim 1, wherein the p-side of the diode-laser bar is bonded to the metalized first surface of the submount by a hard-solder layer.

6. The apparatus of claim 5, wherein the hard-solder layer is made of a gold-tin alloy.

7. The apparatus of claim 1, wherein the second surface of the submount is bonded to the base-element by a soft-solder layer.

8. The apparatus of claim 7, wherein the soft-solder layer is made of an indium silver alloy.

9. The apparatus of claim 1, wherein the base-element includes a coolant channel.

10. The apparatus of claim 1, further including a third electrical contact and a third flexible electrical connector, the third electrical contact on an electrical insulator attached to the base-element and spaced apart from the submount, the third flexible electrical connector extending between the third electrical contact and the n-side of the diode-laser bar and wherein the third electrical contact is located on the side of the submount opposite to the side where the second electrical contact is located.

11. The apparatus of claim 10, wherein the first, second, and third flexible electrical connectors are made using wire-bond technology.

12. The apparatus of claim 10, wherein the first, second, and third flexible electrical connectors are made using ribbon-bond technology.

13. Electro-optical apparatus comprising:
    first and second diode laser assemblies, each diode laser assembly comprising;
    a base-element;
    an electrically-insulating submount having first and second opposite surfaces, the first surface being metallized, and the second surface being bonded to the base-element;
    first and second diode-laser bars, each diode-laser bar having a p-side and an n-side, the p-sides being bonded to the metallized first surface of the submount, leaving a portion thereof exposed, wherein each bar includes an array of emitters emitting light in a forward direction;
    first, second, and third electrical contacts each thereof on an electrical insulator attached to the base-element and spaced apart from the submount and wherein the first electrical contact is located behind the submount and the second and third electrical contacts are located on opposite sides of the submount;
    a first flexible electrical connector extending between the first electrical contact and the exposed metalized layer on the submount;
    a second flexible electrical connector extending between the second electrical contact and the n-side of the first diode-laser bar;
    a third flexible electrical connector extending between the third electrical contact and the n-side of the second diode-laser bar and wherein the first diode laser assembly is mounted vertically with respect to the second diode laser assembly, with the emitter arrays of both assemblies being substantially coplanar; and
    an electrical interconnect between the first electrical contact of the first diode laser assembly and one of the second or third electrical contacts of the second diode laser assembly.

14. The apparatus of claim 13, wherein the metalized first surface of the submount is made of copper.

15. The apparatus of claim 13, wherein the diode-laser bar is made of gallium arsenide and the submount is made of beryllium oxide.

16. The apparatus of claim 13, wherein the diode-laser bar is made of indium phosphide and the submount is made of aluminum nitride.

17. The apparatus of claim 13, wherein the p-side of the diode-laser bar is bonded to the metalized first surface of the submount by a hard-solder layer.

18. The apparatus of claim 13, wherein the second surface of the submount is bonded to the base-element by a soft-solder layer.

19. The apparatus of claim 13, wherein the first, second, and third flexible electrical connectors are made using wire-bond technology.

20. The apparatus of claim 13, wherein the first, second, and third flexible electrical connectors are made using ribbon-bond technology.

* * * * *